United States Patent [19]
Branson

[11] Patent Number: 5,075,569
[45] Date of Patent: Dec. 24, 1991

[54] OUTPUT DEVICE CIRCUIT AND METHOD TO MINIMIZE IMPEDANCE FLUCTUATIONS DURING CROSSOVER

[75] Inventor: Christopher W. Branson, Hillsboro, Oreg.

[73] Assignee: Tektronix, Inc., Beaverton, Oreg.

[21] Appl. No.: 607,223

[22] Filed: Nov. 5, 1990

Related U.S. Application Data

[63] Continuation of Ser. No. 325,263, Mar. 17, 1989, abandoned.

[51] Int. Cl.$^5$ .................... H03K 3/01; H03K 17/16; H03K 17/56; H03K 5/13
[52] U.S. Cl. .................... 307/270; 307/443; 307/243; 307/576; 307/603; 307/597
[58] Field of Search ............... 307/270, 443, 451, 243, 307/571, 576, 579, 585, 602, 605, 291, 292, 234, 603; 328/55, 58

[56] References Cited

U.S. PATENT DOCUMENTS

| | | | |
|---|---|---|---|
| 3,959,731 | 5/1976 | Pomerantz et al. | 307/600 |
| 4,675,546 | 6/1987 | Shaw | 307/265 |
| 4,754,163 | 6/1988 | Aue et al. | 307/265 |
| 4,797,585 | 1/1989 | Segawa et al. | 307/605 |
| 4,825,102 | 4/1989 | Iwasawa et al. | 307/451 |

*Primary Examiner*—Stanley D. Miller
*Assistant Examiner*—Trong Phan
*Attorney, Agent, or Firm*—Boulden G. Griffith

[57] ABSTRACT

An output driver circuit of the type having two transmission gates, which are preferably CMOS transmission gates, is improved by inserting a variable, and preferably digitally programmable, pulse stretcher in the path of both the high-enable and the low-enable signals that open and close the high-side and low-side transmission gates. The variable delay element of the pulse stretcher can be set to an optimum delay by an "empirical" procedure that entails applying a series of pulses of incrementally varying duration to the output driver circuit, while monitoring the quality of waveform that they produce. A few of these waveforms will be distorted as a result of the impedance mismatch. The variable delay element of the pulse stretcher is then repeatedly adjusted. For each value of variable delay, another series of pulses of incrementally varying duration are again applied to the output of the driver circuit while the quality of the waveforms produced is monitored. The optimum value for the variable delay element setting is the value that most effectively minimizes the distortion in the monitored waveforms. After this empirical procedure has been used to determine one set of optimum timing values, another "inferred" method can then be used to measure the turn on and turn off times that resulted from the empirical method. Thereafter, this inferred method can be used to set the timing on other similar output driver circuits to these same times, without going through the more lengthy empirical procedure again.

11 Claims, 7 Drawing Sheets

OUTPUT DEVICE CIRCUIT AND METHOD TO MINIMIZE IMPEDANCE FLUCTUATIONS DURING CROSSOVER

This is a continuation of application of Ser. No. 325,263 filed Mar. 17, 1989 and now abandoned.

BACKGROUND OF THE INVENTION

This invention relates to the field of output driver or buffer circuits, and more particularly to the field of minimizing crossover impedance fluctuations during state transitions of an output driver circuit having two transmission gates whose active impedances nominally match the circuit or transmission line being driven.

When testing integrated circuit devices or modules, low-distortion input waveforms are required at the input terminals of the device under test (DUT). The input terminals of the DUT and the output driver of the tester are separated by a transmission line which shall be referred to as the tester I/O path. The tester output driver circuit generates waveforms that travel the tester I/O path and provide stimulus to the input terminal of the DUT.

U.S. Pat. No. 4,707,620 describes an adjustable impedance driver network comprising a plurality of CMOS (complementary metal-oxide semiconductor) transmission gates each of which is separately controlled by programmable digital input codes to vary the overall impedance of the network in its conducting state. While this CMOS driver (or buffer) has the advantages of an adjustable output impedance, fast rise times that permit operation up to 100 MHz or more, and relatively low cost, it suffers from the disadvantage of not producing a stable impedance during transitions between logic states.

FIG. 1 is a simplified schematic diagram of a prior art output driver circuit on a CMOS integrated circuit (IC), a tester I/O path external to the IC, and a device under test (DUT). The DUT circuitry may or may not, at any given time, provide a termination resistor to a termination voltage. The circuitry of the output driver includes two CMOS transmission gate networks and an associated control logic circuit. When an Inhibit signal is asserted (high), both CMOS transmission gate networks are held off and the driver is in a high impedance state, effectively disconnected from the tester I/O path. If the driver is not inhibited, a logic "1" on the Data input turns on the upper CMOS transmission gate network and thereby connects the V-high voltage level to the tester I/O path through the nominal impedance of the CMOS transmission gate. When Data is a logic "0", the lower CMOS transmission gate network is turned on and the V-low voltage level is connected to the tester I/O path through the nominal impedance of that CMOS transmission gate.

FIG. 2 is a timing diagram showing how the output impedance of the driver circuitry may vary during logic state transitions due to different propagation delays through the control logic circuitry of FIG. 1. Slight variations between the transition times of the low-enable signal and the high-enable signal can lead to intervals of very high (or too low) impedance on the output. The control circuit shown in FIG. 1 consistently turns off the currently enabled transmission gate before turning on the other one, so the impedance fluctuation is always in the high direction.

Normally, the impedance of the output driver circuitry is approximately matched to the impedance of the tester I/O path. But, during these transition intervals with their very high impedance, a serious impedance mismatch occurs and this can cause problems under some circumstances. In particular, if a reflected voltage wavefront arrives back at the driver during one of these periods, the resulting impedance mismatch causes a strong reflection back toward the DUT and the signal quality is degraded. In other cases, even when the tester I/O path is terminated, those periods when one device has turned off before the other device turns on can cause glitches and other aberrant behavior, depending on the voltage to which the tester I/O path is being terminated.

What is desired is a method and apparatus for minimizing the amount of impedance mismatch that occurs during a transition in logic states in an output driver circuit having two transmission gates whose active impedances nominally match the circuit or transmission line being driven.

SUMMARY OF THE INVENTION

The present invention is an improved output driver (buffer) circuit of the type having two transmission gates whose active impedances nominally match the circuit or transmission line being driven, and a method for using this circuit to minimize the amount of output impedance fluctuation that occurs during a transition in logic states.

The improvement to the output driver circuit consists of inserting a variable, and preferably digitally programmable, pulse stretching circuit in the path of both the high-enable and the low-enable signals that open and close the high-side and low-side transmission gates. A pulse stretching circuit, or pulse stretcher, is any circuit that delays pulse edges of one polarity, while not delaying pulse edges of the other polarity.

The variable delay element of the pulse stretcher can be set to an optimum delay by an "empirical" method that entails applying a series of pulses of incrementally varying duration to the output driver circuit, while monitoring the quality of waveform that they produce. A few of these waveforms are distorted as a result of the fact that the initial wavefront sent from the driver was reflected from the DUT end of the I/O path, and arrived back at the driver during the time of the impedance mismatch. The variable delay element of the pulse stretcher is then repeatedly adjusted. For each value of variable delay, another series of pulses of incrementally varying duration are again applied to the output of the driver circuit while the quality of the waveforms produced is monitored. The optimum value for the variable delay element setting is the value that most effectively minimizes the distortion in the monitored waveforms.

After the empirical procedure has been used to determine one set of optimum timing values, an "inferred" method can then be used to measure the turn on and turn off times that produced the optimum timing values. Thereafter, this inferred method can be used to set the timing on other devices to these same times, without going through the more lengthy empirical procedure.

DETAILED DESCRIPTION

Figure 3:
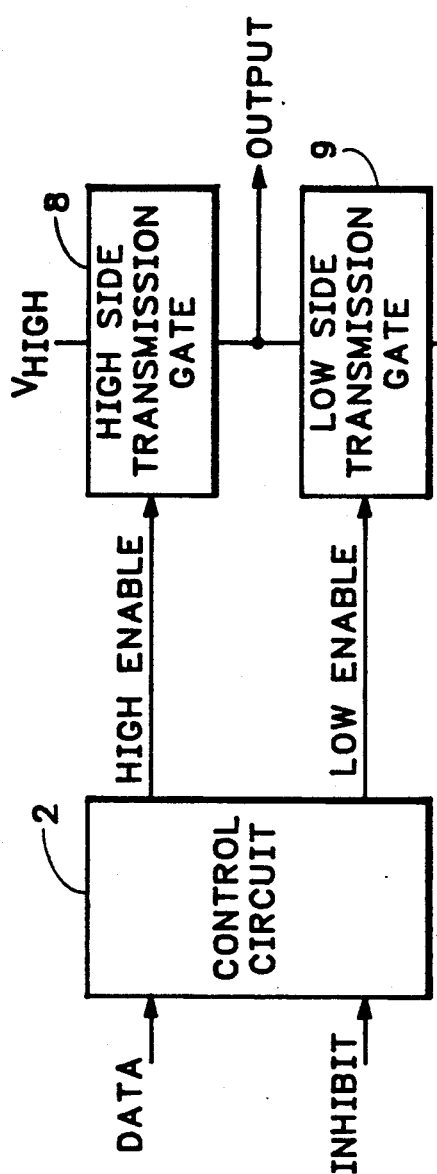
FIG. 3 is a block diagram of a generalized output driver circuit.

FIG. 3 is a block diagram of a generalized output driver circuit having high-side and low-side transmission gates whose active impedances nominally match the impedance of the circuit or transmission line being driven. The term "transmission gate", is used herein in its broadest sense and refers to any FET-like or MOS-type device or their functional equivalents. That is, any device with some nominal active impedance state and a high impedance state that can be controlled to connect or disconnect two other circuits from each other through the nominal active impedance. In a narrower sense, the term "transmission gate" refers to CMOS transmission gates, which are a type of transmission gate with ideal characteristics. In a CMOS transmission gate p-channel and n-channel devices are arranged in parallel, so that the changes in the nominal resistance of the two channels cancel out as the source and drain voltages approach the control voltages, whereas in a device relying on a single channel type the resistance changes significantly as this occurs. When the narrower definition is intended, the term "CMOS transmission gate" will be used.

Referring to FIG. 3, when a logical "1" appears on the data line, in the absence of a logical "1" on the inhibit line, the control circuit 2 produces an asserted signal condition on the high-enable signal line and an unasserted condition on the low-enable signal line. An asserted signal condition on the high-enable signal line causes the high-side transmission gate 8 to change its impedance from a very high value approaching infinity to its nominal active value. The unasserted signal condition on the low-enable signal line causes the low-side transmission gate 9 to change its impedance from its nominal active value to a very high value approaching infinity.

Unless the relative timing of the high-enable signal and the low-enable signal is precisely correct, the transitions in impedance value for the transmission gates 8,9 will not be occurring at exactly the same time, with the result that the impedance presented to the output varies during the transition from one logical value to another.

Figure 4:
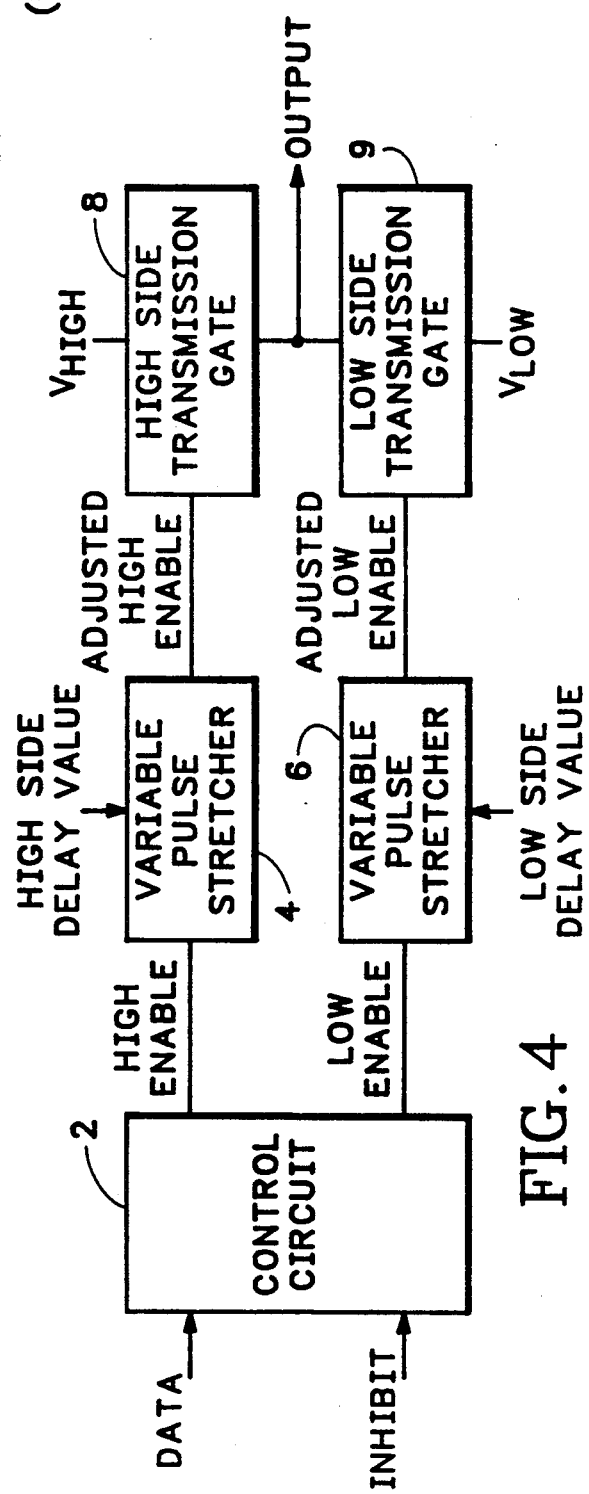
FIG. 4 is a block diagram of a generalized output driver circuit improved according to the present invention.

FIG. 4 shows the generalized output driver circuit of FIG. 3 with a variable pulse stretcher 4,6 inserted in each enable signal path. With a proper selection of delay values for these variable pulse stretchers, the adjusted high-enable and low-enable signals can be made to have the exact timing relationship necessary to minimize the variation in the output impedance of the driver circuit during logic state transitions.

Figure 1:
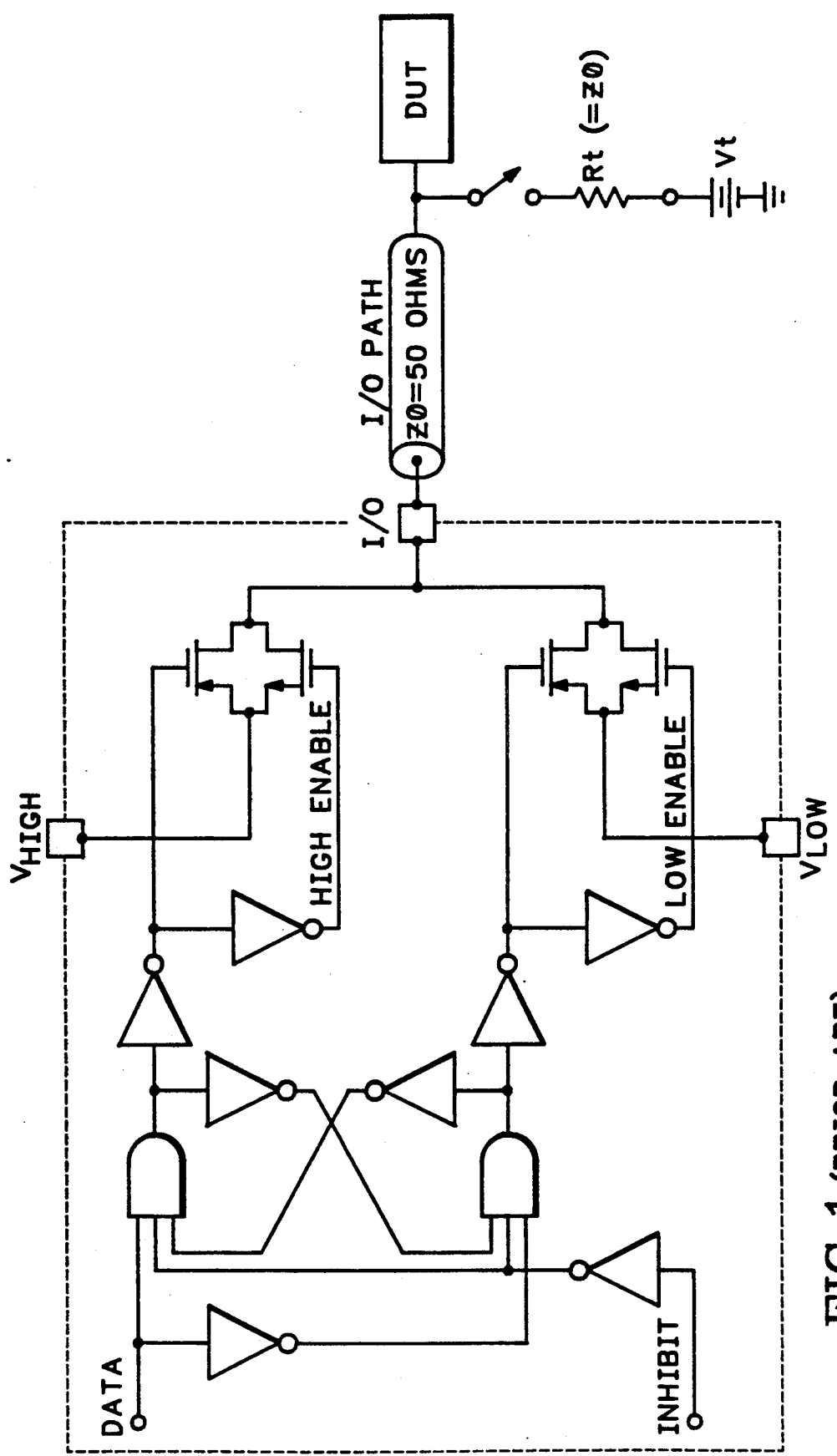
FIG. 1 is schematic diagram of a prior art CMOS output driver circuit.
Figure 2:
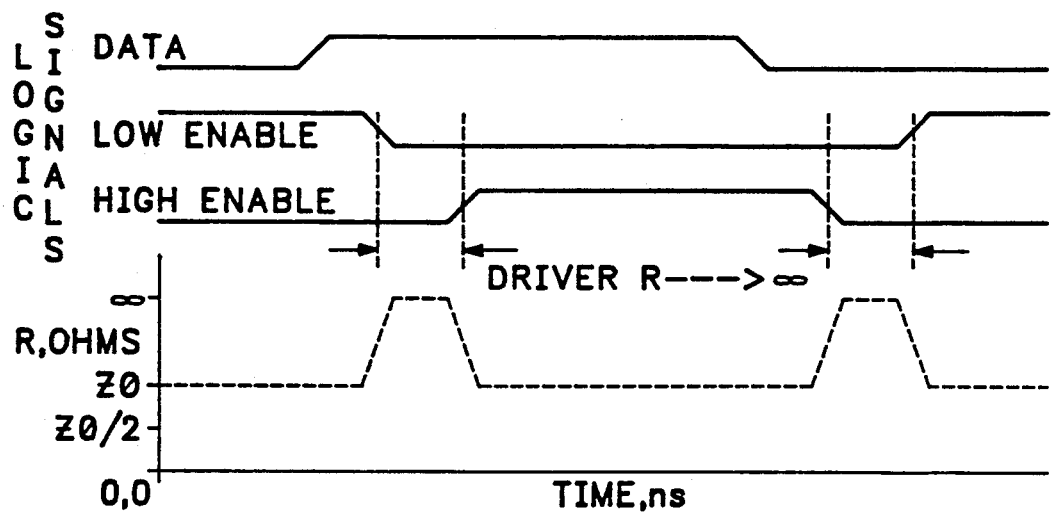
FIG. 2 is a timing diagram illustrating how intervals of impedance mismatch occur.
Figure 5:
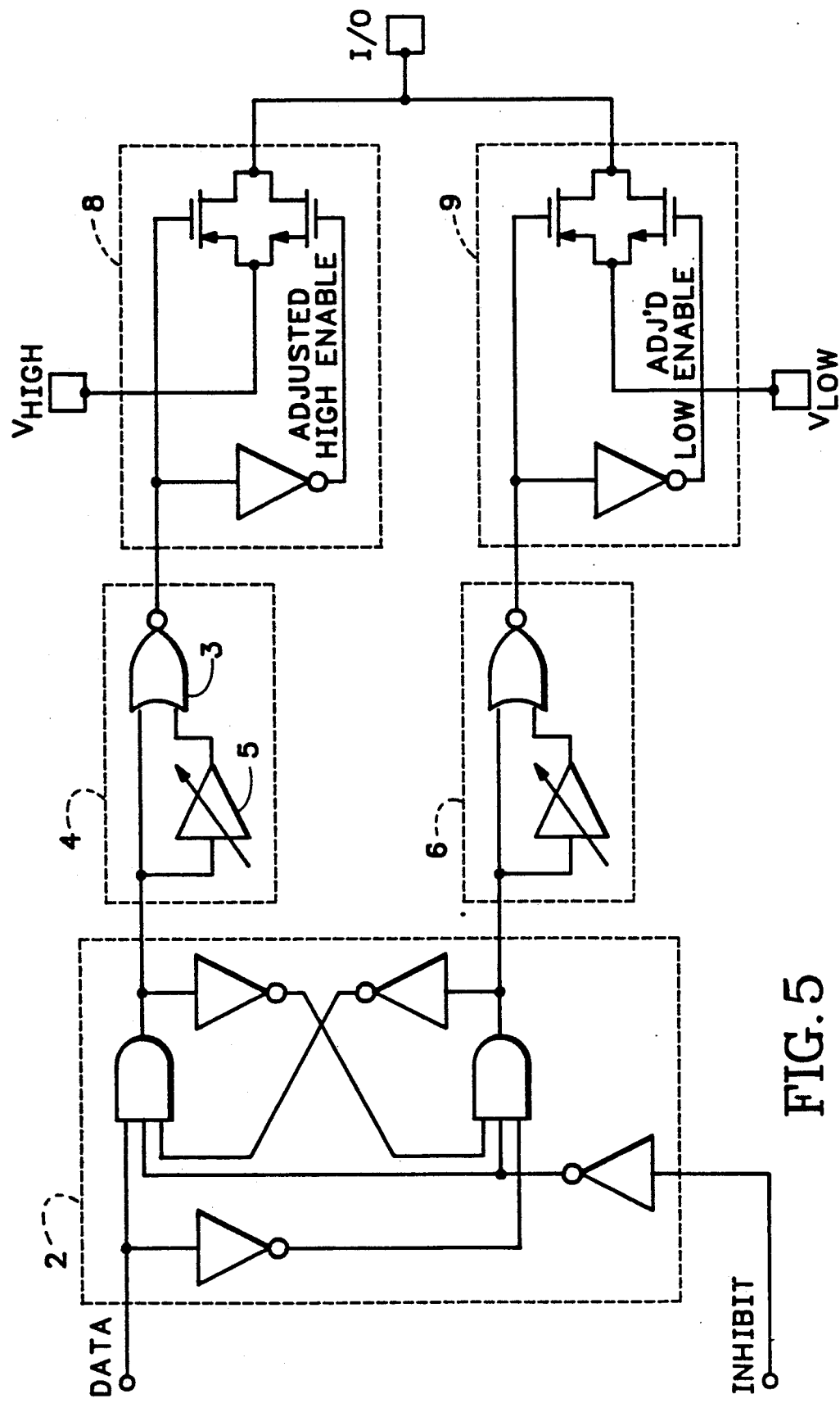
FIG. 5 is a schematic diagram of an improved CMOS output driver circuit according to the present invention.

FIG. 5 is a schematic diagram of an output driver circuit employing CMOS transmission gates, as shown in FIG. 1, but improved according to the present invention, as shown in FIG. 4. Variable pulse stretcher 4 can be seen to comprise NOR gate 3 and variable delay element 5, with the high-enable signal from the control circuit 2 applied directly to one input of the NOR gate and indirectly to the other input through the variable delay element. Ideally, the variable delay element is digitally programmable, so as to conveniently lend itself to microprocessor control.

Figure 6:
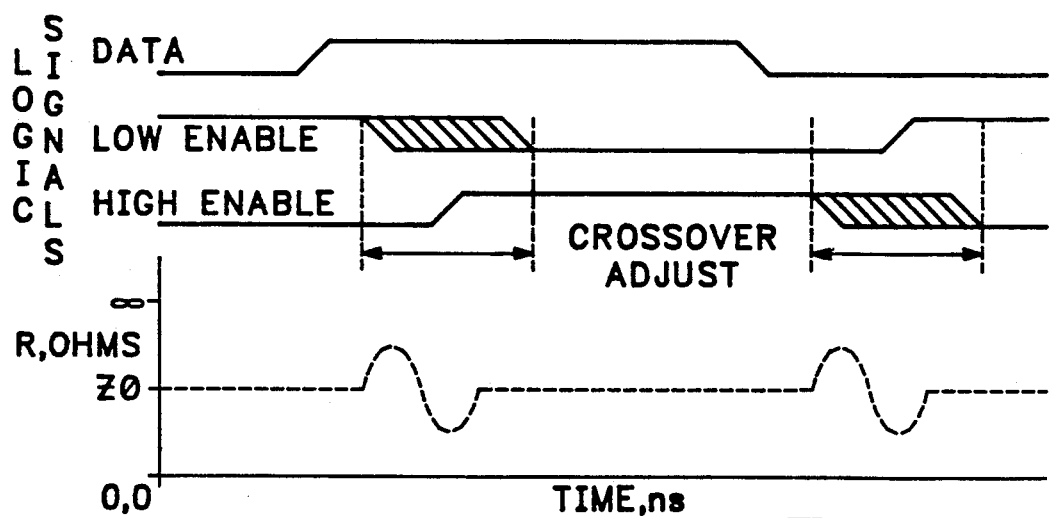
FIG. 6 is a timing diagram illustrating part of the calibrating procedure according to the present invention.

FIG. 6 shows how the application of different values to the programmable variable delay elements 5 (in FIG. 5) can be used to move the negative-going edges of the low-enable and high-enable signals to minimize the amplitude and duration of the impedance mismatch. The impedance values shown in the bottom half of FIG. 6 are not measured directly, but rather are inferred from the presence or absence of distortion in the shape of a series of pulses, each having incrementally differing durations, as they are monitored at the terminated end (device under test end) of the tester I/O path. This approach has and will be referred to as the "empirical method".

Figure 7A:
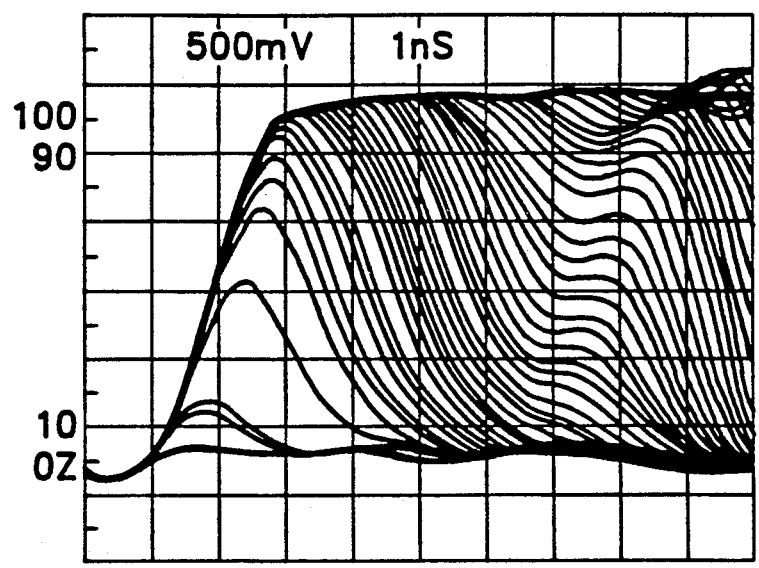
FIG. 7A shows a series of pulses, each having incrementally differing durations, with distortion present indicating an impedance mismatch.
Figure 7B:
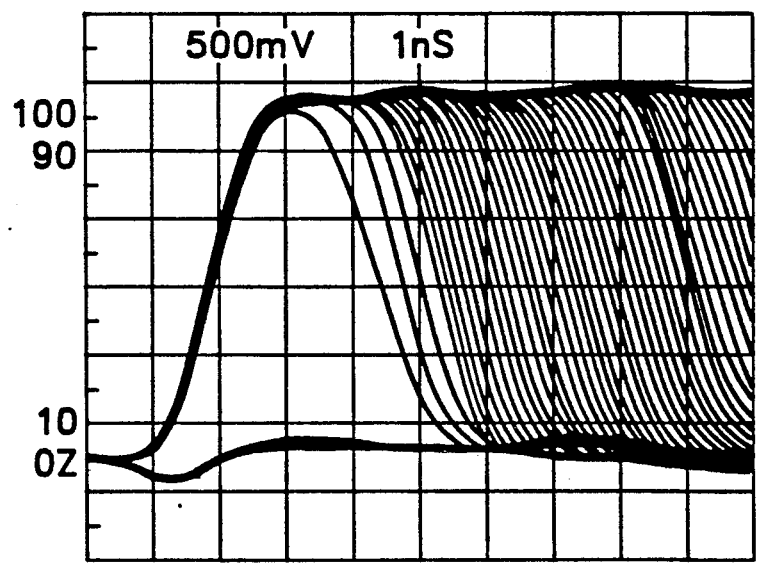
FIG. 7B shows a series of pulses, each having incrementally differing durations, with minimum distortion present indicating a minimization of impedance mismatch.

FIG. 7A shows a series of pulses, each having incrementally differing durations, with distortion clearly present on some of them indicating an impedance mismatch. If such a series of pulses is examined for each of a variety of pulse stretcher delay values, one of the delay values produces a series of pulses with a minimum of distortion, as shown in FIG. 7B.

Figure 8A:
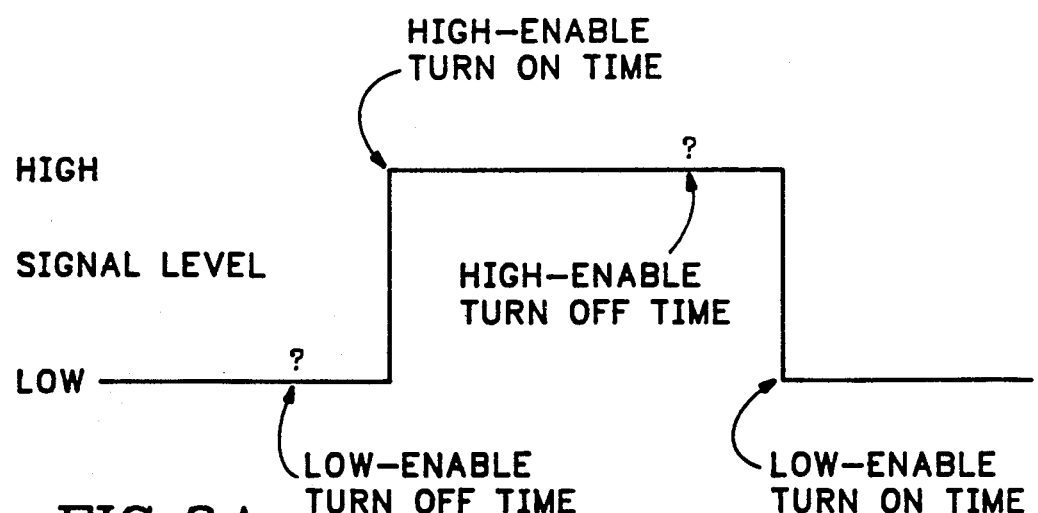
FIG. 8A shows how the high-enable and the low-enable turn on points may be measured using an unterminated output driver pulse.

Referring now to FIG. 8A, with the tester I/O path unterminated, the signal level at the output of the driver does not react immediately when the low-enable signal causes the low-side CMOS transmission gate to go to its high impedance state. Rather, the signal level reacts when the high-enable causes the high-side CMOS transmission gate to go to its nominal impedance state. Similarly, during the low-going transition, the signal level at the output of the driver does not react immediately when the high-enable signal causes the high-side CMOS transmission gate to go to its high impedance state. Rather, the output signal level reacts when the low-enable causes the low-side CMOS transmission gate to go to its nominal impedance state. Thus, from operation of the output driver with the tester I/O path unterminated, the high-enable and low-enable turn on times can be located in time relative to some convenient reference signal, such as the Data input to the control circuitry 2.

Figure 8B:
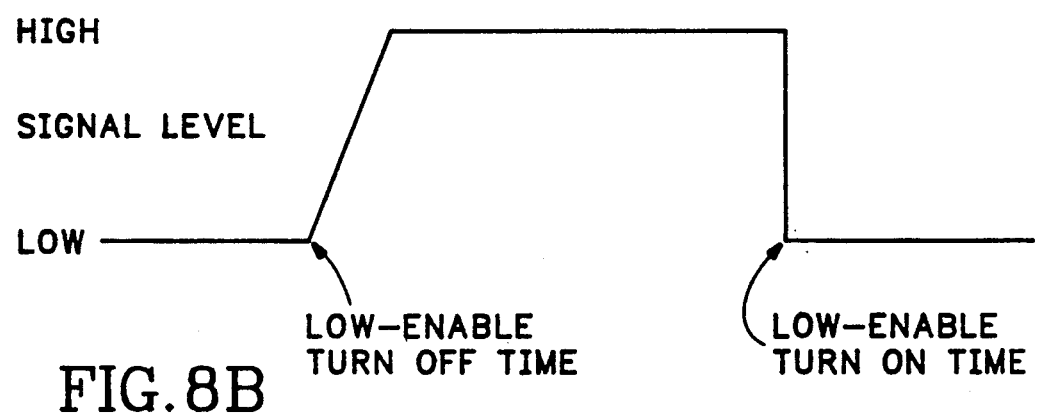
FIG. 8B shows how the low-enable turn off point may be measured by terminating the driver output with a resistor and disabling the high-side transmission gate.
Figure 8C:
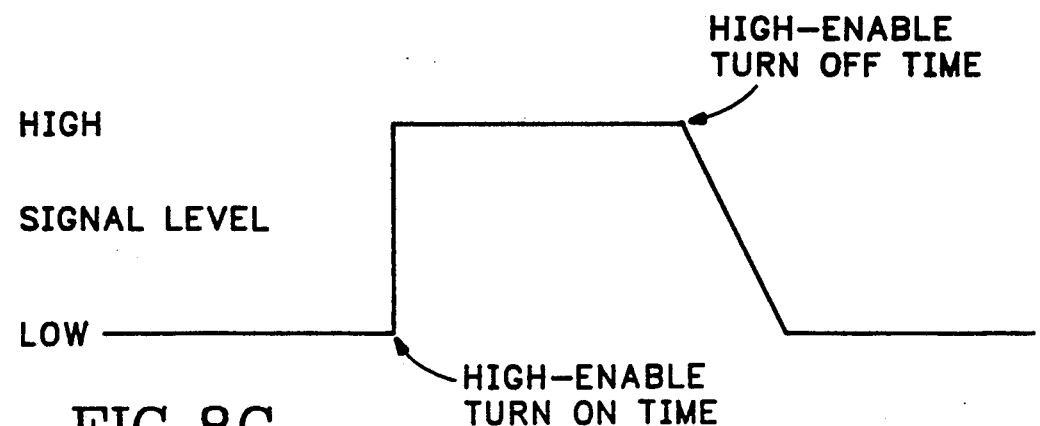
FIG. 8C shows how the high-enable turn off point may be measured by terminating the driver output with a resistor and disabling the low-side transmission gate.
Figure 9:
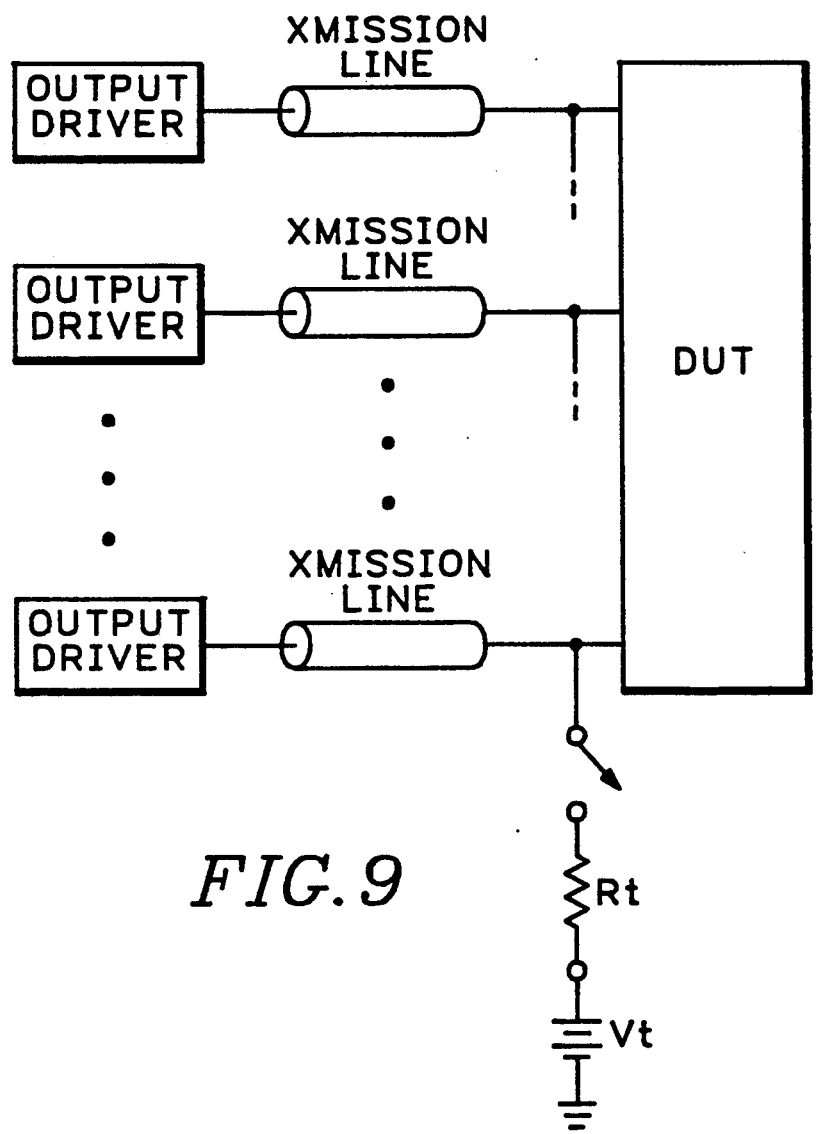

Referring now to FIG. 8B, with the tester I/O path replaced with a resistor and the high-side CMOS transmission gate temporarily disabled, the location in time of the low-enable turn off can be established. (If the CMOS transmission gate is of the improved type disclosed in U.S. Pat. No. 4,707,620, so that the nominal active resistance can be adjusted, this adjustment capability can be used to set the nominal active impedance to nearly infinity, thereby, in effect, disabling it.) And, similarly, as shown in FIG. 8C, with the tester I/O path replaced with a resistor and the low-side CMOS transmission gate temporarily disabled, the location in time of the high-enable turn off can also be established.

Using the technique just described for measuring the turn on and turn off times of both CMOS transmission gates, which shall be referred to as the "inferred method", the times for an output driver circuit whose transition impedance fluctuations have already been minimized according to the empirical method described earlier can be measured. With these times established, they can then be used in conjunction with further application of the inferred method to set the variable delay elements of other "similar" uncalibrated output drivers without further resort to the empirical method. By "similar" it is meant that the inferred method will only work for output drivers wherein the transmission gate circuitry was produced by the same process using identical mask sets, so that the local timing characteristics of the transmission gates are the same.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

I claim:

1. An improved output driver circuit of the type having a control circuit for generating a high-enable signal and a low-enable signal, a high-side transmission gate coupled to the control circuit over a high-enable signal path, and a low-side transmission gate coupled to the control circuit over a low-enable signal path, wherein the improvement comprises:
   means coupled between the control circuit and the high-side transmission gate in the high-enable signal path for adjusting the trailing edge of the high-enable signal to produce a stretched high-enable signal for controlling the high-side transmission gate; and
   means coupled between the control circuit and the low-side transmission gate in the low-enable signal path for adjusting the trailing edge of the low-enable signal to produce a stretched low-enable signal for controlling the low-side transmission gate.

2. An improved output driver circuit as recited in claim 1 wherein the adjusting means each comprises a two-input NOR gate and a variable delay element, with the respective enable signal coupled directly to one input of the NOR gate and indirectly coupled to the other input of the NOR gate through the variable delay element to produce the respective stretched enable signal at the output of the NOR gate.

3. An improved output driver circuit as recited in claim 2 wherein the variable delay element is digitally programmable.

4. An improved output driver circuit as recited in claim 1 wherein the high-side and low-side transmission gates comprise CMOS transmission gates.

5. A method for minimizing impedance mismatch between a transmission line and an output driver circuit coupled to drive the transmission line, wherein the output driver circuit is of the type having a high-side transmission gate disposed between a high-side voltage and an output, and a low-side transmission gate disposed between a low-side voltage and the output, and a control circuit for generating a high-enable signal and a low-enable signal, the high-enable signal being applied to a first variable pulse stretcher to produce an adjusted high-enable signal with a delayed trailing edge and the low-enable signal being applied to a second variable pulse stretcher to produce an adjusted low-enable signal with a delayed trailing edge, and with the adjusted high-enable signal being coupled to turn on the high-side transmission gate and the adjusted low-enable signal being coupled to turn on the low-side transmission gate, the method comprising the steps of:
   incrementally varying the delay applied by the first variable pulse stretcher over a first set of delay values;
   for each incrementally varied delay, sending a series of high-going pulses having incrementally varying durations through the output driver circuit to drive the transmission line;
   for each pulse in the series of high-going pulses, monitoring an amount that a monitored waveform differs from a predetermined waveform;
   selecting from the first set of delay values as a desired delay value for the first variable pulse stretcher the delay value that produced a minimum amount of difference between the resulting waveform and the predetermined waveform for the series of high-going pulses;
   incrementally varying the delay applied by the second variable pulse stretcher over a second set of delay values;
   for each incrementally varied delay, sending a series of low-going pulses having incrementally varying durations through the output driver circuit to drive the transmission line;
   for each pulse in the series of low-going pulses, monitoring an amount that a resulting waveform differs from a predetermined waveform;
   selecting from the second set of delay values as a desired delay value for the second variable pulse stretcher the delay value that produced a minimum amount of difference between the resulting waveform and the predetermined waveform for the series of low-going pulses.

6. A method as recited in claim 5 comprising the further steps of:
   determining a first timing relationship between a low-enable turn off time and a high-enable turn on time and a second timing relationship between a high-enable turn off time and a low-enable turn on time, and
   setting the desired delay values of other similar output driver circuits according to the first and second determined timing relationships.

7. A method as recited in claim 6 wherein the determining step comprises the steps of:
   with the transmission line unterminated locating high-enable and low-enable turn on times relative to a reference signal;
   with the transmission line terminated and the high-side transmission gate disabled locating a low-enable turn off time relative to the reference signal;
   with the transmission line terminated and the low-side transmission gate disabled locating a high-enable turn off time relative to the reference signal; and
   calculating a difference between the low-enable turn off time and the high-enable turn-on time, the difference representing the first determined timing relationship; and calculating a difference between the high-enable turn off time and the low-enable turn on time, the difference representing the second determined timing relationship.

8. A method as recited in claim 6 wherein the setting step comprises the steps of:

with the transmission line unterminated locating high-enable and low-enable turn on times relative to the reference signal;

with the transmission line terminated and the high-side transmission gate disabled selecting a low-enable turn off time to satisfy the first determined timing relationship; and with the transmission line terminated and the low-side transmission gate disabled selecting a high-enable turn off time to satisfy the second determined timing relationship.

9. A method for minimizing impedance mismatch between a transmission line and a plurality of output driver circuits, each circuits being coupled to drive the transmission line circuit when an impedance mismatch between the transmission line and one of the output driver circuits has previously been minimized, wherein the output driver circuits are of the type having a control circuit for generating a high-enable signal and low enable signal, a high-side transmission gate being coupled to the control circuit via a high-enable signal path and responsive to the high-enable signal, and a low-side transmission gate being coupled to the control circuit via a low-enable signal path and responsive to the low-enable signal, and having pulse stretcher circuits, each including a variable delay element, disposed in the high-enable and low-enable signal paths between the control circuit and respective transmission gates, the method comprising the steps of:

determining a first timing relationship between a low-enable turn off time and a high-enable turn on time and a second timing relationship between a high-enable turn off time and a low-enable turn on time for the output driver circuit whose impedance mismatch was previously minimized, and setting desired delay values of the plurality of output driver circuits.

10. A method as recited in claim 9 wherein the determining step comprises the steps of:

with the transmission line unterminated locating high-enable and low-enable turn on times relative to a reference signal;

with the transmission line terminated and the high-side transmission gate disabled locating a low-enable turn off time relative to the reference signal;

with the transmission line terminated and the low-side transmission gate disabled locating a high-enable turn off time relative to the reference signal; and calculating a difference between the low-enable turn off time and the high-enable turn-on time, the difference representing the first determined timing relationship; and calculating a difference between the high-enable turn off time and the low-enable turn on time, the difference representing the second determined timing relationship.

11. A method as recited in claim 9 wherein the setting step comprises the steps of:

with the transmission line unterminated locating high-enable and low-enable turn on times relative to a reference signal;

with the transmission line terminated and the high-side transmission gate disabled selecting a low-enable turn off time to satisfy the first determined timing relationship; and with the transmission line terminated and the low-side transmission gate disabled selecting a high-enable turn off time to satisfy the second determined timing relationship.

* * * * *